United States Patent
Brunne et al.

(10) Patent No.: US 10,644,473 B2
(45) Date of Patent: May 5, 2020

(54) EXTEME ULTRAVIOLET RADIATION PRODUCING SYSTEMS WITH DRIVER LASER SYSTEMS HAVING OPTICAL ISOLATORS

(71) Applicant: TRUMPF Lasersystems for Semiconductor Manufacturing GmbH, Ditzingen (DE)

(72) Inventors: Jens Brunne, Stuttgart (DE); Matthias Wissert, Stuttgart (DE); Guenther Krauss, Ditzingen (DE)

(73) Assignee: TRUMPF Lasersystems for Semiconductor Manufacturing GmbH, Ditzingen (DE)

( * ) Notice: Subject to any disclaimer, the term of this patent is extended or adjusted under 35 U.S.C. 154(b) by 0 days.

(21) Appl. No.: 16/059,526

(22) Filed: Aug. 9, 2018

(65) Prior Publication Data
US 2018/0375278 A1 Dec. 27, 2018

Related U.S. Application Data

(63) Continuation of application No. PCT/EP2016/052774, filed on Feb. 10, 2016.

(51) Int. Cl.
*H01S 3/00* (2006.01)
*G03F 7/20* (2006.01)
(Continued)

(52) U.S. Cl.
CPC ........ *H01S 3/0064* (2013.01); *G03F 7/70033* (2013.01); *H05G 2/008* (2013.01); *H01S 3/2232* (2013.01); *H01S 3/23* (2013.01)

(58) Field of Classification Search
CPC ........ H01S 3/0064; H01S 3/2232; H01S 3/23; G03F 7/70033; H05G 2/008
(Continued)

(56) References Cited

U.S. PATENT DOCUMENTS 4,194,813 A    3/1980  Benjamin et al.
6,181,719 B1 * 1/2001  Sukhman ............. H01S 3/0975
                                              372/38.1
(Continued)

FOREIGN PATENT DOCUMENTS

CN           104416284      3/2015
WO    WO 2014/119199    8/2014
(Continued)

OTHER PUBLICATIONS

Figueira et al., "Plasma-Breakdown Retropulse Isolators for the Infrared," Applied Optics, Mar. 1981, 5: 838-841.
(Continued)

*Primary Examiner* — Nicole M Ippolito
(74) *Attorney, Agent, or Firm* — Fish & Richardson P.C.

(57) ABSTRACT

Driver laser systems for EUV radiation producing apparatuses are disclosed that include a beam source for producing laser radiation propagating in a first direction, an amplifier arrangement comprising at least one optical amplifier for amplifying the laser radiation propagating in the first direction, and at least one optical isolator. The optical isolator includes a chamber filled with a gas, through which chamber the laser radiation propagating in the first direction passes, and a plasma generating device configured for the pulsed ignition of a plasma in the gas of the chamber to suppress passage of laser radiation propagating in a second direction, opposite to the first direction, through the chamber. EUV radiation producing apparatuses that include such driver laser systems are also disclosed.

24 Claims, 2 Drawing Sheets

(51) Int. Cl.
*H05G 2/00* (2006.01)
*H01S 3/223* (2006.01)
*H01S 3/23* (2006.01)

(58) Field of Classification Search
USPC .......................................... 250/493.1, 504 R
See application file for complete search history.

(56) References Cited

U.S. PATENT DOCUMENTS

| | | | |
|---|---|---|---|
| 9,667,019 | B2 | 5/2017 | Moriya et al. |
| 9,762,024 | B2 | 9/2017 | Kurosawa et al. |
| 10,244,613 | B2* | 3/2019 | Chimmalgi ............. H01J 65/04 |
| 2015/0208494 | A1 | 7/2015 | Rafac et al. |
| 2016/0007434 | A1 | 1/2016 | Tao et al. |
| 2017/0278694 | A1* | 9/2017 | Chuang ................ H01J 61/025 |

FOREIGN PATENT DOCUMENTS

| WO | WO 2015/045102 | 4/2015 |
|---|---|---|
| WO | WO 2015/082004 | 6/2015 |

OTHER PUBLICATIONS

Hill et al., "Breakdown thresholds in rare and molecular gases using pulsed 10•6 μm radiation," Journal of Physics D: Applied Physics, 1972, 5: L97-L99.

International Preliminary Report on Patentability in International Application No. PCT/EP2016/052774, dated Aug, 23, 2018, 10 pages (English translation).

International Search Report and Written Opinion in International Application No. PCT/EP2016/052774, dated Oct. 20, 2016, 14 pages (with English translation).

Ireland et al., "Focal-length dependence of air breakdown by a 20-psec laser pulse," Appl Phys Lett, 1974, 24: 175-177.

Panarella et al., "Focal-length dependence of air breakdown by a 20-psec laser pulse," Phys. Rev. Lett, 1974, 33: 950-953.

Williams et al., "Picosecond air breakdown studies at 0.53 μm" Appl. Phys. Lett, 1983, 44: 352-354.

JP Office Action in Japanese Appln. No. 2018-541686, dated Nov. 13, 2019, 8 pages (with English translations).

* cited by examiner

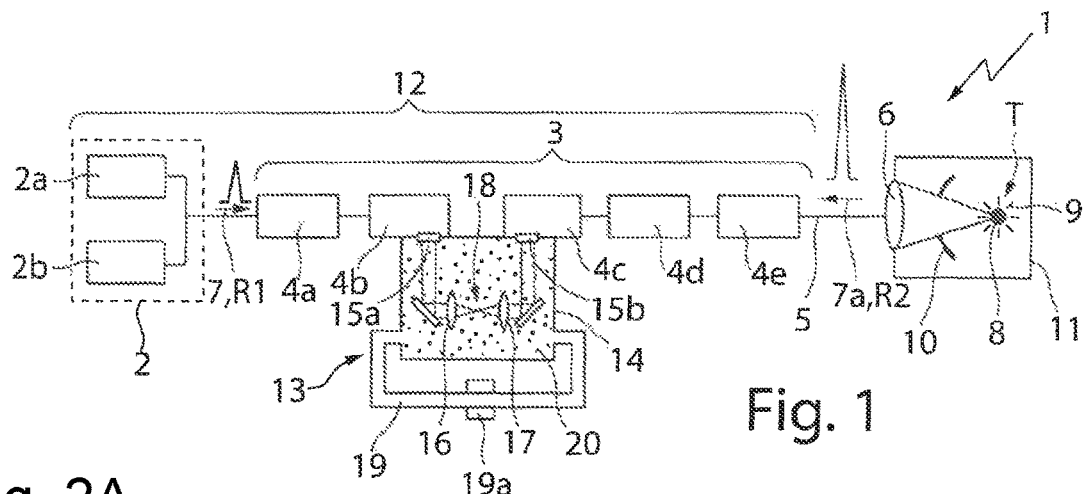
Fig. 1
Fig. 2A
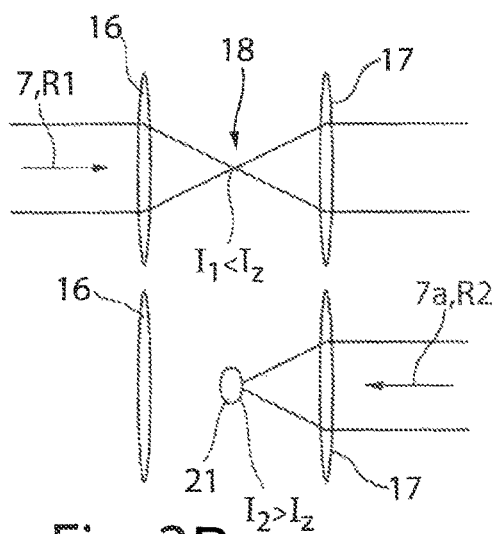
Fig. 2B
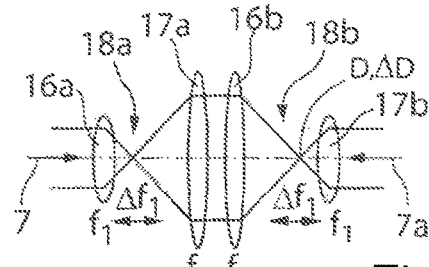
Fig. 3A
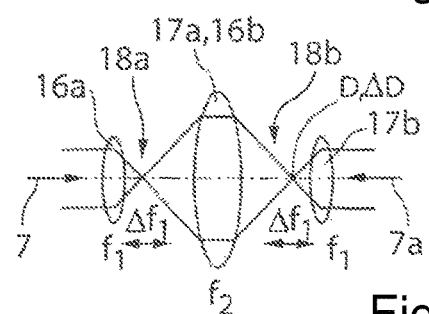
Fig. 3B
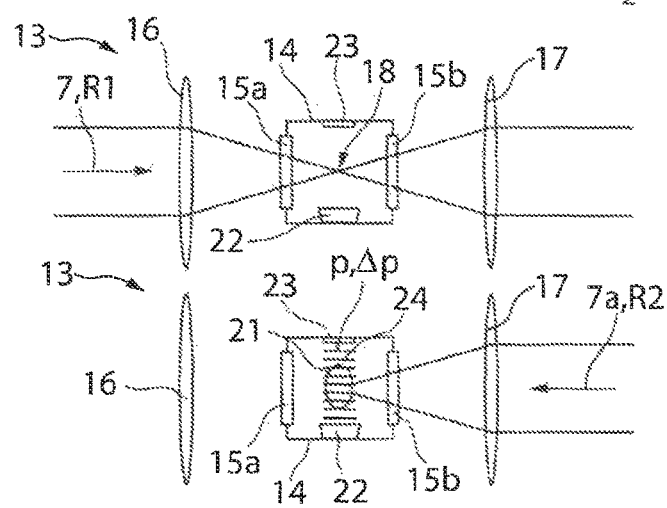
Fig. 4A
Fig. 4B

EXTEME ULTRAVIOLET RADIATION PRODUCING SYSTEMS WITH DRIVER LASER SYSTEMS HAVING OPTICAL ISOLATORS

CROSS REFERENCE TO RELATED APPLICATIONS

This application is a continuation of and claims priority under 35 U.S.C. § 120 from PCT Application No. PCT/EP2016/052774 filed on Feb. 10, 2016, the entire content of which is incorporated herein by reference.

TECHNICAL FIELD

The present invention relates to driver laser systems for an extreme ultraviolet (EUV) radiation producing apparatus and EUV radiation producing apparatuses including such a driver laser system.

BACKGROUND

So-called laser produced plasma (LLP), EUV light sources, or EUV radiation producing apparatuses include a driver laser system that includes a beam source, for example, a $CO_2$ laser, for producing pulsed laser radiation (i.e., a sequence of laser pulses). The pulsed laser radiation is typically amplified by a plurality of optical amplifiers of an amplifier arrangement of the driver laser system. The laser radiation produced and amplified by the driver laser system is fed via a beam guiding device to a focusing device, which focuses the laser radiation in a target region at which is provided a target material, for example in the form of tin droplets, which upon irradiation with the laser radiation transitions to a plasma state and emits EUV radiation in the process.

In the case of such an EUV radiation producing apparatus, a portion of the pulsed laser radiation is reflected back from the target material and passes through the beam guiding device and the optical amplifiers of the amplifier arrangement in the reverse direction, such that the back-reflected laser radiation is likewise amplified. As a result, the gain of the amplifier medium in the optical amplifiers decreases, such that the maximum achievable power during the amplification of the laser radiation propagating in the forward direction, i.e., in the direction of the target material, is reduced. Typically, it is also necessary to filter the back-reflected laser radiation to protect the beam source from destruction by the back-reflected laser radiation. If conventional optical isolators, e.g., in the form of Faraday isolators or in the form of electro-optical modulators are used, this is possible only up to a limited maximum power of the laser radiation, because the optical isolators are otherwise damaged by the back-reflected laser radiation.

WO 2015/082004 A1 discloses an amplifier arrangement for example for a driver laser system of an EUV radiation producing apparatus, wherein the amplifier arrangement includes an optical isolator including a polarizer device and a phase shifting device. At least the polarizer device is positioned at a location at which the laser radiation has a laser power of more than 500 W.

As a result of the optical filtering in an optical isolator configured as described above, a thermal lens is typically produced in the filtering element of the optical isolator, which thermal lens disadvantageously alters the divergence or the beam properties of the forward-traveling laser radiation or of the forward-traveling laser beam. If the maximum power limit of the filtering optical element is attained, moreover, the EUV radiation producing apparatus or the EUV lithography apparatus has to be shut down. Since a restart of the EUV lithography apparatus causes a significant loss of time, the productivity of the EUV lithography apparatus is reduced as a result.

An added difficulty in such systems is that optical isolators based on the polarization or phase shift principle, in a manner governed by the design, can suppress laser radiation only upon the occurrence of a specific sudden phase change or a specific phase shift (e.g., 180°). The value for such sudden phase change or phase shift is possibly not complied with upon reflection at a droplet, such that for this reason, too, the laser radiation reflected at the droplet cannot be completely suppressed by such an optical isolator.

WO 2015/045102 A1 describes a laser apparatus including a master oscillator, which emits a pulsed laser beam. The pulsed laser beam is amplified in a plurality of optical amplifiers arranged in the optical beam path of the pulsed laser beam. The laser apparatus can additionally include a light reflector that allows the pulsed laser beam to pass through it, wherein the light reflector reflects self-oscillating radiation produced at one of the plurality of amplifiers. The laser apparatus also includes a radiation absorber, which takes up and absorbs the self-oscillating radiation reflected by the light reflector.

US 2015/0208494 A1 describes an EUV light source in which a target material is provided at a target position and an amplified laser beam that propagates in the direction of the target position is focused in a focal plane. The target position is situated outside the focal plane and an interaction between the amplified laser beam and the target material converts at least part of the target material into a plasma that emits EUV radiation. Back-reflections in the EUV light source are intended to be reduced in this way.

U.S. Pat. No. 4,194,813 discloses an optical isolator for suppressing back-reflections emanating from a target irradiated by means of a laser. The optical isolator includes a disk, e.g., composed of aluminum or tantalum, arranged in a vacuum chamber, with a diaphragm aperture arranged in the beam path of the laser. The beam path is guided through the chamber. The isolator additionally includes means for focusing laser radiation onto the edge of the diaphragm aperture to damage the edge of the diaphragm aperture and to generate a plasma in the process. U.S. Pat. No. 4,194,813 also specifies that other methods are known for protecting a $CO_2$ laser beam from the back-reflection thereof at a target, wherein the methods usually include the formation of a plasma discharge in air. One such method includes a discharge at a foil composed of Mylar® by means of the laser pulse itself or by means of an auxiliary laser beam. Other methods include a gas discharge in the vicinity of a focal point, wherein a reflector is used to concentrate the energy of the marginal region of the laser beam at a center, such that the electric field of the laser beam exceeds a plasma ignition threshold in air. Elsewhere, discharges are intended to be produced by applying an overvoltage pulse to a small region, wherein the pulse is synchronized with the laser beam.

In addition to the problem of back-reflections during the amplification of laser pulses in an optical amplifier arrangement or generally in an optical amplifier, so-called self-oscillations ("self-lasing") or so-called "amplified spontaneous emission" (ASE) can occur, i.e., amplified spontaneous emissions that can lead to the limitation of the gain in a respective amplifier stage and, in the worst case, even to the destruction thereof. ASE increases the signal background, such that even without the presence of an input signal to be amplified in the form of a pulsed laser beam or in the form of laser pulses in an optical amplifier, radiation is generated. Although self-lasing in an amplifier arrangement can be limited by reducing the reflective surfaces in this way to reduce the number of passes, in general it cannot be completely suppressed.

SUMMARY

The invention provides driver laser systems and EUV radiation producing apparatuses that enable effective plasma back-reflection protection and, if appropriate, the suppression of self-lasing.

In one embodiment, the invention includes a driver laser system in which the optical isolator includes a chamber filled with a gas, through which chamber the laser radiation propagating in the first direction passes, and in which the optical isolator includes a plasma generating device configured for the pulsed ignition of a plasma in the gas of the chamber to suppress passage of laser radiation propagating in a second direction, opposite to the first direction, through the chamber. The laser radiation propagating in the second direction is typically laser radiation produced by the beam source, amplified in the amplifier arrangement, and reflected back to the amplifier arrangement.

In the case of the driver laser system according to the invention, the plasma generating device is configured, for the purpose of pulsed ignition of a plasma or of a gas discharge, to act directly on the gas situated in the chamber, i.e., to interact directly with gas in the chamber. In the present plasma generating device, the plasma is not generated by an interaction of the laser radiation with an evaporable material present in the chamber, e.g., in the form of a diaphragm or an edge of a diaphragm aperture. By way of example, no evaporable material, e.g., in the form of a diaphragm, may be present in the chamber. If an evaporable material, e.g., a diaphragm, is arranged in the chamber, the location at which the plasma is generated in the gas of the chamber is at a distance from the diaphragm. Thus, even in this case the gas discharge or the plasma generation is effected as a result of a direct action or interaction of the plasma generating device with the gas situated in the chamber, rather than indirectly by way of the evaporation of material.

The chamber typically has an entrance window for the entrance of the laser radiation propagating in the first direction into the chamber, and also an exit window for the emergence of the laser radiation propagating in the first direction from the chamber. The pulsed laser radiation propagating in the second direction is typically impeded from passing through the chamber by the pulsed ignition of the plasma or the gas discharge, i.e., the laser radiation propagating in the second direction enters the chamber through the exit window, but does not emerge, or emerges at least to a significantly attenuated extent, from the chamber through the entrance window. That location in the chamber at which the interaction of the plasma generating device with the gas of the chamber takes place is arbitrary in principle, but in general at least partly overlaps the beam path of the laser radiation propagating in the first and/or in the second direction, effectively to prevent or to suppress as much as possible the passage of the laser radiation propagating in the second direction through the chamber.

The solution described here is suitable, in principle, both for laser radiation produced by gas lasers, for example by $CO_2$ gas lasers, and is amplified in corresponding optical amplifiers, and for laser radiation produced by solid-state lasers or possibly by other lasers, for example, by fiber lasers, and is amplified in corresponding optical amplifiers.

The generation of a plasma with the aid of laser radiation has been disclosed for example in the article "Picosecond air breakdown studies at 0.53 µm," W. E. Williams et al., Appl. Phys. Lett. 43(4), 1983, 352-354, or the article "Focal-length dependence of air breakdown by a 20-psec laser pulse," Applied Physics Letters, 24 (5), 1974, which is incorporated herein by reference in its entirety.

In one embodiment, the optical isolator additionally includes a focusing device for focusing the laser radiation propagating in the first direction onto a laser beam focal point in the chamber, and preferably a collimation device for collimating the laser radiation emanating from the laser beam focal point and propagating in the first direction. Typically, the laser radiation propagating in the first direction enters the chamber in a collimated fashion through the entrance window and emerges from the chamber in a collimated fashion through the exit window. The focusing device and the collimation device can form a beam telescope, in particular, that is to say that they are arranged substantially at the distance of their focal lengths from one another. At the laser beam focal point the laser radiation has its maximum intensity in the chamber, such that the gas discharge or the plasma, if this is ignited by the laser radiation propagating in the second direction, is typically generated in the region of the laser beam focal point. Both the focusing device and the collimation device can comprise one or more reflective optical elements, for example in the form of mirrors, and/or one or more transmissive optical elements, for example in the form of lenses.

In a further embodiment, an intensity of the laser radiation propagating in the first direction in the gas of the chamber, in particular at the laser beam focal point, is less than a plasma ignition threshold for the ignition of the gas discharge in the gas of the chamber, and the intensity of the laser radiation propagating in the second direction in the gas of the chamber, in particular at the laser beam focal point, is greater than the plasma ignition threshold for the ignition of the gas discharge in the gas of the chamber. If this is the case, a gas discharge or a plasma is ignited by the pulsed laser radiation propagating in the second direction in the gas of the chamber. The laser radiation propagating in the second direction is absorbed or reflected in the plasma—depending on the intensity—and therefore does not leave the chamber through the entrance window in the direction of the beam source and further optical elements that are possibly arranged between the beam source and the optical isolator and might likewise be damaged by the laser radiation propagating in the second direction.

In this case, the focusing device and the collimation device serve jointly as a plasma generating device, wherein the intensity of the laser radiation propagating in the first direction at the laser beam focal point is typically chosen such that it lies just below the plasma ignition threshold. Given a suitable arrangement of the optical isolator in the driver laser system, to put it more precisely, in the amplifier arrangement, the intensity of the laser radiation propagating in the second direction, which laser radiation is typically laser radiation of the beam source that is amplified in the amplifier arrangement and reflected back to the amplifier arrangement, is greater than the intensity of the laser radiation propagating in the first direction, such that the optical isolator forms a purely passive back-reflection protection based on a plasma ignited by the laser radiation propagating in the second direction. In other words, the laser beam propagating in the second direction extinguishes itself in the chamber as a result of the gas discharge or the formation of the plasma.

The optical isolator is preferably arranged at a location in the amplifier chain at which the laser radiation propagating in the first direction has a higher intensity or power than the reflected-back laser radiation propagating in the second direction. In the case of an amplifier arrangement including one or more optical amplifiers connected in series, the optical isolator is preferably arranged in the beam path of the laser radiation propagating in the first direction upstream of a first (optical) amplifier, upstream of a second (optical) amplifier, or upstream of a third (optical) amplifier of the amplifier arrangement. If the optical amplifier is arranged upstream of the second optical amplifier, the amplifier arrangement generally includes at least three optical amplifiers, that is to say that the second optical amplifier is followed by at least one further (third) optical amplifier. The same applies to the case where the optical isolator is arranged upstream of the third optical amplifier, that is to say that at least one further (fourth) optical amplifier follows the third optical amplifier, upstream of which the optical isolator is arranged.

The entrance window of the chamber can coincide with an exit window of one of the optical amplifiers. Likewise, the exit window of the chamber can coincide with the entrance window of a further, downstream optical amplifier of the amplifier arrangement to enable a minimal material outlay and a compact design. However, it is also possible to arrange the chamber in a manner spatially separated from the optical amplifiers.

In a further embodiment, the optical isolator is configured to set a plasma ignition threshold for ignition of the plasma in the chamber and, if appropriate, for setting the optical properties of the plasma (absorbing or reflective). The plasma ignition threshold in the gas of the chamber depends on various parameters, at least one of which can be varied to alter or set the plasma ignition threshold. These parameters are, for example, the gas pressure in the chamber, the composition of the gas in the chamber, and the (maximum) intensity of the (pulsed) laser radiation in the chamber.

In one embodiment, the focusing device and/or the collimation device are/is configured for setting a focus diameter of the laser beam focal point in the chamber. With the aid of an adaptive focusing and collimation device, it is possible to set the (maximum) intensity of the laser radiation in the chamber, which occurs at the laser beam focal point, by way of the diameter of the laser beam focal point to alter the plasma ignition threshold.

In another embodiment, the focusing device and/or the collimation device include(s) at least one optical element displaceable along a beam direction of the laser radiation and/or at least one optical element having a variable focal length. The optical element having a variable focal length can be, e.g., an adaptive mirror or an adaptive lens, the refractive power of which can be set by an alteration of its geometry (e.g., with the aid of actuators). These adaptive or settable optical elements can be combined, if appropriate, with a manual or motorized alteration of the distance between the optical elements in the beam direction of the laser radiation. However, the focusing device and the collimation device can also consist of rigid optical elements that are not variable in terms of their geometry and the relative distance between which is altered manually or in a motorized manner for the purpose of setting the diameter of the laser beam focal point. The focusing and collimation device can also include exchangeable lens and/or mirror elements having different focal lengths, which are exchanged in an automated or motorized manner, i.e., with the aid of actuators, or manually, if appropriate, to set the focal length and thus the diameter of the laser beam focal point.

In a further embodiment, the optical isolator includes a gas pressure setting device for setting a gas pressure of the gas in the chamber. As described above, the gas pressure in the chamber influences the plasma ignition threshold. It has proved to be advantageous to produce in the chamber a defined gas atmosphere that simplifies the formation of a plasma and selective filtering of the laser radiation reflected back or propagating in the second direction. The gas present in the chamber or in the gas atmosphere of the chamber can be, for example, nitrogen, but also, if appropriate, helium or argon, or mixtures of these gases. The nitrogen in the chamber can have, for example, a pressure of between approximately 50 mbar and approximately 2 bar. Suitable pressure ranges for various gases and for laser radiation at a wavelength of 10.6 μm can be gathered for example from the article "Breakdown thresholds in rare and molecular gases using pulsed 10.6 μm radiation," by G. A. Hill et al., Journal of Physics D, Vol. 5, No. 11, 1972, which is incorporated herein by reference in its entirety.

In another embodiment, the gas pressure setting device is configured to generate a standing acoustic wave in the chamber, in particular in the region of the laser beam focal point. The standing acoustic wave makes it possible to adapt the (local) pressure in the chamber, in particular in the region in which the plasma is intended to be ignited, i.e., typically at the laser beam focal point. In this case, the gas pressure setting device typically includes at least one acoustic transducer, e.g., in the form of a loudspeaker that converts electrical signals into acoustic signals. If an acoustic transducer is used, it can be combined with a surface that reflects the acoustic wave emanating from the transducer, or an acoustic reflector, to generate the standing acoustic wave. However, the standing acoustic wave can also be generated by two or more acoustic transducers or by a combination of acoustic transducers and reflective surfaces.

In a further embodiment, the optical isolator includes a device for setting a composition of the gas in the chamber. As was described above, the gas in the chamber can contain for example nitrogen or a noble gas, e.g., helium or argon, or a mixture thereof. The device serves for setting the composition or the mixture ratio of the constituents of the gas that is present in the chamber or is fed to the chamber.

In a further embodiment, the optical isolator includes a gas circuit for feeding the gas into the chamber and for discharging the gas from the chamber. The chamber is gastight and typically includes at least one gas inlet and at least one gas outlet to exchange the gas in the chamber as rapidly as possible. The gas pressure in the chamber can be set or regulated with the aid of a gas pressure setting device by means of the flow rate of the gas or by means of (fast) flow control or flow regulation of the gas through the chamber. The gas can circulate within a closed gas circuit, wherein the gas is circulated by means of a pump. If a fan, for example, a turbo radial fan, is used as a pump, the gas can be simultaneously cooled and the power absorbed in the plasma can be emitted before the gas once again flows back into the chamber via the gas inlet.

In a further embodiment, the plasma generating device includes an excitation laser for producing (pulsed) excitation laser radiation and a feeding device for feeding the excitation laser radiation into the chamber for the purpose of heating the gas in the chamber, in particular in the region of the laser beam focal point. Like the beam source, the excitation laser is also typically operated in a pulsed fashion and is generally synchronized with the beam source such that the excitation laser radiation is not fed to the chamber if the (pulsed) laser radiation propagating in the first direction passes through the chamber.

In one embodiment, the excitation laser is a short-pulse laser or an ultrashort-pulse laser. A short-pulse laser is suitable for producing pulses having pulse durations that are typically in the nanoseconds range; an ultrashort-pulse laser is suitable for producing extremely short laser pulses having pulse durations in the picoseconds or possibly femtoseconds range and very fast pulse sequences. This is advantageous, because the laser pulses of the beam source likewise have a high pulse repetition frequency and short pulse durations, such that the use of pulsed excitation laser radiation having pulse durations of less than approximately 50 nanoseconds is advantageous.

The excitation laser can be used in various ways in the optical isolator. By way of example, the excitation laser can be used for setting the plasma ignition threshold if the plasma is generated passively by the laser radiation reflected back or propagating in the second direction. In this case, the excitation laser typically heats the gas in the region of the laser beam focal point to such a great extent that even in the case of a comparatively weak back-reflection having a low intensity, a plasma is ignited in which the back-reflected laser radiation is absorbed, without thereby influencing the laser radiation propagating in the first direction.

Alternatively, the power of the excitation laser and thus the intensity of the excitation laser radiation entering the chamber can be increased to such an extent that the latter is sufficient to ignite a plasma itself, that is to say that the intensity of the laser radiation amplified in the amplifier arrangement is not additionally required. The locally delimited plasma is not sufficient, however, to suppress the back-reflection completely. Part of the power of the laser radiation propagating in the second direction is absorbed in the plasma, however, which leads to a further expansion of the plasma and thus to the formation of the full filter performance by the plasma.

Alternatively, the power of the excitation laser and thus the intensity of the excitation laser radiation in the chamber can be increased to such an extent that the latter ignites a plasma that has a sufficient extent to completely absorb or reflect the back-reflection.

In one embodiment, the feeding device includes a focusing optical unit for focusing the excitation laser radiation in the chamber. The focusing optical unit can serve, in particular, to focus the excitation laser radiation at the laser beam focal point of the laser radiation propagating in the first direction and in this way to generate a sufficient intensity for the ignition of the plasma, although this is not required, as will be described below.

In a further implementation, a diaphragm is arranged in the chamber, and the laser radiation propagating in the first direction passes through the diaphragm aperture of the diaphragm, wherein one side of the diaphragm forms a reflective focusing optical unit for focusing the excitation laser radiation. The diaphragm is typically a spatial diaphragm, e.g., composed of copper, which is aligned centrally with respect to the beam axis of the laser radiation. The material of the diaphragm or, if appropriate, the material of a coating applied to the diaphragm for reflecting the excitation laser radiation, is coordinated with the wavelength of the excitation laser radiation. By way of example, a diaphragm composed of copper or a reflective coating composed of gold, for example, applied to the side of the diaphragm, makes it possible to reflect excitation laser radiation at wavelengths of, e.g., approximately 1030 nm. The use of aluminum as a material of the diaphragm or of the coating makes it possible to reflect excitation laser radiation in the visible wavelength range.

The laser beam focal point of the laser radiation produced by the beam source is typically situated in the region of the diaphragm aperture. The diaphragm, to put it more precisely, a side of the diaphragm, typically includes at least one conical section or conical surface that can be used to focus the excitation laser radiation in the direction of the beam axis of the laser radiation. The excitation laser radiation reflected at a conical section of the diaphragm typically forms a quasi-Bessel beam having an elongated focus zone, which converges along the center axis of the diaphragm and which is adjusted with regard to the beam axis of the laser radiation passing through the diaphragm. The diaphragm is typically configured rotationally symmetrically with respect to its center axis, and adjusted such that the center axis of the diaphragm corresponds to the beam axis of the laser radiation. The elongated focus zone lengthens the region in which the excitation laser radiation can interact with the laser radiation passing through the diaphragm to form a plasma.

In one embodiment, the feeding device is configured to radiate the excitation laser radiation in the form of a hollow beam omitting the diaphragm aperture onto the side of the diaphragm preferably facing away from the beam source. The excitation laser radiation is reflected at that side of the diaphragm that typically extends conically in a radial direction, and is focused toward the center axis of the diaphragm. By virtue of the use of the hollow beam, the excitation laser radiation does not pass through the diaphragm aperture, with the result that it does not pass into the amplifier arrangement and cannot lead to damage there. To produce a hollow beam, i.e., excitation laser radiation having a rotationally symmetrical beam profile with a central region having no or only a low intensity, the feeding device can comprise an axicon, for example, which typically includes two conically shaped surfaces. The conically shaped surfaces can be displaced in the manner of a telescope or can be altered in terms of their distance from one another to adapt the beam profile suitably.

In a further embodiment, the driver laser system includes a control device configured to drive the excitation laser for producing the excitation laser radiation for the ignition of a plasma in the gas of the chamber also between the emergence of the laser radiation propagating in the first direction from the chamber and the entrance of the laser radiation propagating in the second direction into the chamber. The control device can alternatively or additionally guide the excitation laser even after the suppression of the laser radiation propagating in the second direction and before further laser radiation (i.e., a subsequent laser pulse) propagating in the first direction and entering the chamber, for ignition of a plasma in the gas of the chamber. In particular, a plasma can be permanently ignited in the chamber, wherein only the time duration during which the laser radiation propagating in the first direction traverses the chamber is excluded from the generation of the plasma.

As a result of the ignition of the plasma in the chamber even in time periods in which the laser radiation propagating in the second direction does not pass through the chamber, a largely complete optical decoupling (=Q-switching) can be effected with the aid of the optical isolator. If the optical isolator in this case is arranged between two optical amplifiers of the amplifier arrangement, the latter are optically isolated from one another, such that no parasitic laser process, i.e., no self-lasing, can occur.

In another embodiment, the driver laser system includes a switchable element for selecting pulses of the excitation laser radiation. Such a switchable element can be arranged for example in the beam path of the feeding device between the excitation laser and the chamber to select individual excitation laser pulses in a targeted manner ("pulse picking"). The selection of pulses of the excitation laser radiation is typically carried out by the suppression of unrequired or undesired pulses of the excitation laser radiation to produce a desired pulse sequence. The switchable element, for example in the form of an electro-optical or acousto-optical modulator, can also be integrated into the excitation laser to select individual excitation laser pulses in a targeted manner ("cavity dumping"). In both cases, the switchable element should be synchronized with the beam source, to put it more precisely with the laser pulses of the beam source.

In a further embodiment, the driver laser system includes at least two optical isolators, and the feeding device includes at least one beam splitter for splitting the excitation laser radiation between the two optical isolators or between respective chambers of the optical isolators. By using two or more optical isolators at different locations of the amplifier arrangement, it is possible to achieve the maximum suppression of back-reflections or the maximum suppression of self-lasing. In order not to have to use a dedicated excitation laser for each optical isolator, the excitation laser radiation, to put it more precisely, the power thereof, can be split between two or more optical isolators at one or more beam splitters.

In another embodiment, the feeding device includes at least one delay section for delaying the excitation laser radiation before the feeding to at least one optical isolator. By means of the at least one delay section, the excitation laser radiation can be temporally adapted such that it reaches the respective chamber at least at the point in time at which or during that time period in which the laser radiation propagating in the second direction also enters the chamber, to prevent the laser radiation from passing through the chamber or to attenuate the laser radiation to the greatest possible extent. The delay generated by the respective delay section is suitably adapted to the pulse sequence of the pulsed laser radiation that is produced by the beam source.

The invention also relates to an EUV radiation producing apparatus, including a driver laser system as described herein, a vacuum chamber, in which a target material is arranged, and a beam guiding device for guiding the laser radiation propagating in the first direction from the driver laser device to the target material. As described further above, the (pulsed) laser radiation propagating in the first direction impinges on the target material, e.g., in the form of tin droplets, and is partly reflected at the target material. The laser radiation reflected back at the target material propagates in the second direction along the beam guiding device, once again passes through the amplifier arrangement and is filtered at the at least one optical isolator by means of the ignition of a plasma in the chamber, the ignition having been described further above, such that the laser radiation cannot return to the beam source.

The optical isolators described herein or the plasma switch can also be used in optical systems other than in an EUV radiation producing apparatus or in a driver laser system, for example in the case of optical systems such as pulsed solid-state lasers or solid-state amplifiers or the like. In particular, such an optical isolator can comprise an excitation laser configured as described herein in connection with the driver laser system and focus the excitation laser radiation, e.g., by means of a diaphragm as described herein.

Further advantages of the invention are evident from the description and the drawing. Likewise, the features mentioned herein can each be used by themselves or as a plurality in arbitrary combinations. The embodiments shown and described should not be understood as an exhaustive enumeration, but rather are of an exemplary character for outlining the invention.

DESCRIPTION OF DRAWINGS

In the figures:

FIG. 1 is a schematic diagram that shows an EUV radiation producing apparatus including a driver laser system that includes an optical isolator having a chamber filled with a gas and also a plasma generating device for ignition of a plasma in the chamber.

FIGS. 2A and 2B are a pair of related schematic illustrations of pulsed laser radiation propagating in the optical isolator of FIG. 1 in a first direction and in a second direction through a focusing and collimation device, which forms a passive plasma generating device.

FIGS. 3A and 3B are schematic illustrations of a focusing and collimation device including four and respectively including three lenses having a settable focal length for setting a focus diameter of the laser radiation.

FIGS. 4A and 4B are a pair of related schematic illustrations analogous to FIGS. 2A and 2B, with a device for generating a standing acoustic wave in the chamber in the region of a laser beam focal point.

DETAILED DESCRIPTION

Figure 5:
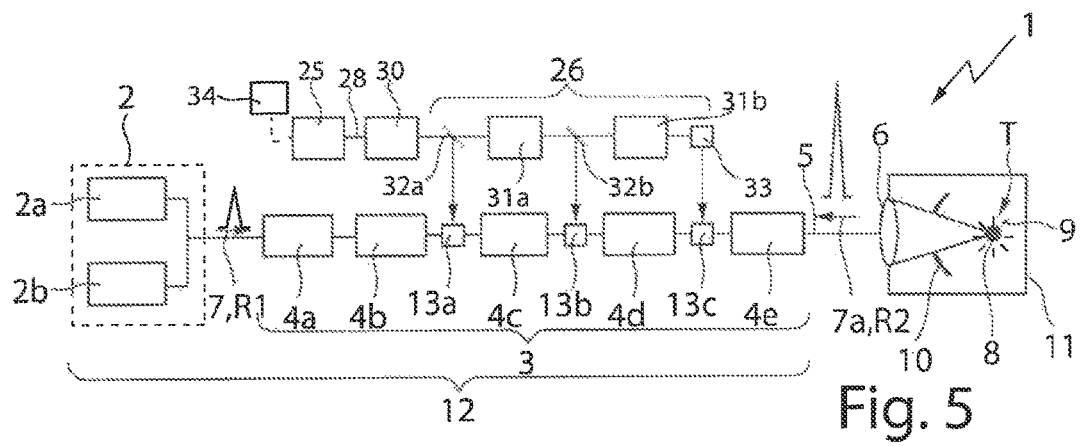
FIG. 5 is a further illustration of an EUV radiation producing apparatus including a driver laser system having three optical isolators and including an excitation laser as an active plasma generating device for ignition of a plasma in the gas of the chamber of a respective optical isolator.

In the following description of the drawings, identical reference signs are used for identical or functionally identical component parts.

FIG. 1 shows an EUV radiation producing apparatus 1 including a beam source 2, an amplifier arrangement 3 including five optical amplifiers 4a-e, a beam guiding device 5, not illustrated in more specific detail, and a focusing optical unit 6, which is illustrated as a focusing lens to simplify the illustration, but can also include one or more reflective optical elements. The focusing optical unit 6 serves to focus a laser pulse 7 (i.e., pulsed laser radiation) generated by the beam source 2 and amplified by the amplifier arrangement 3 at a target region or a target position T, at which a target material 8 is introduced. Upon irradiation with the laser pulses 7, the target material 8 transitions to a plasma state, and emits EUV radiation 9, which is focused by means of a collector mirror 10. In the example shown in FIG. 1, the collector mirror 10 has an opening for passage of the laser pulses 7 and the focusing optical unit 6 separates a vacuum chamber 11 in which the target material 8 is arranged from the beam guiding device 5.

In the case of the example shown in FIG. 1, the beam source 2 is configured as a CO2 laser source and includes a first and second CO2 laser 2a, 2b, which serve to produce a pre-pulse and a main pulse, which follows shortly after the pre-pulse in time and which can have a higher intensity than the pre-pulse. The pre-pulse produced by the first CO2 laser 2a and the main pulse produced by the second CO2 laser 2b are combined to form a common beam path and form the pulsed laser radiation 7 described further above, which emerges from the beam source 2. If appropriate, the pre-pulse and the main pulse can have different wavelengths; in the example shown, however, the pulsed laser radiation 7 has only a single wavelength of approximately 10.6 μm. The beam source 2 together with the amplifier arrangement 3 forms a driver laser system 12 of the EUV radiation producing apparatus 1.

Once the laser radiation 7 coming from the beam source 2 and propagating in a first direction R1 impinges on the target material 8 arranged at the target position T, part of the impinging laser radiation 7 is reflected back from the target material 8 in a second direction R2, opposite to the first direction. The back-reflected laser radiation 7a passes through the beam guiding device 5 and impinges once again on the amplifier arrangement 3, in which the back-reflected laser radiation 7a is amplified. To prevent the back-reflected laser radiation 7a from reaching the beam source 2 or from being amplified to such a great extent that it damages optical components, an optical isolator 13 is arranged between the second optical amplifier 4b and the third optical amplifier 4c in the case of the amplifier arrangement 3 shown in FIG. 1.

The optical isolator 13 includes a chamber 14 having an entrance window 15a for entrance of the pulsed laser radiation 7 propagating in the first direction R1 from the second optical amplifier 4b, and an exit window 15b for emergence of the laser radiation 7 propagating in the first direction R1 from the chamber 14 and for entrance into the third optical amplifier 4c. In the example shown, the entrance window 15a of the chamber 14 coincides with the exit window of the second optical amplifier 4b. Likewise, the exit window 15b of the chamber 14 coincides with the entrance window of the third optical amplifier 4c of the amplifier arrangement 3. In contrast to the illustration shown in FIG. 1, the chamber 14 can also be configured as a structural unit that is spatially separated from the second amplifier 4b and the third amplifier 4c.

In the example shown in FIG. 1, the collimated pulsed laser radiation 7 is focused onto a laser beam focal point 18 in the chamber 14 by a focusing device 16 in the form of a first lens. The laser radiation 7 emanating from the laser beam focal point 18 (intermediate focus) is collimated by a collimation device 17 in the form of a further lens before the laser radiation emerges from the chamber 14 through the exit window 15b and enters the third optical amplifier 4c.

The chamber 14 is connected to a gas circuit 19, which produces in the chamber 14 a defined gas atmosphere of a gas 20 situated in the chamber 14. In the example shown in FIG. 1, the gas 20, for example nitrogen, if appropriate, helium or argon, is fed to the chamber 14 at a gas inlet and is discharged again from the chamber 14 at a gas outlet. The gas 20 situated in the chamber 14 serves to generate in the chamber 14 a plasma 21, as shown in FIG. 2, to suppress the laser radiation 7a propagating in the second direction R2, as is described in greater detail further below in association with FIG. 2.

The gas circuit 19 shown in FIG. 1 can comprise for example a turbo radial fan with gas cooler that the gas 20 flowing out of the chamber 14, which gas heats up during plasma formation on account of the absorption of the laser radiation 7a, is cooled down before being returned to the chamber 14. Other types of gas coolers, for example in the form of heat exchangers, can also be used for cooling the gas 20. In contrast to the illustration shown in FIG. 1, the gas 20 can flow through the chamber 14 substantially transversely with respect to the beam direction of the laser radiation 7.

FIGS. 2A and 2B illustrate a detail of the chamber 14 with the focusing device 16 and the collimation device 17 and also the laser beam focal point 18. FIG. 2A shows the laser radiation 7 propagating in the first direction R1 and having at the laser beam focal point 18 a (maximum) intensity $I_1$ that is less than a plasma ignition threshold $I_Z$ (intensity threshold value) to ignite the plasma 21 directly in the gas 20 situated in the chamber 14.

FIG. 2B illustrates the laser radiation 7a propagating in the second direction R2 and having in the chamber 14, to put it more precisely, at the laser beam focal point 18, an intensity $I_2$ that is greater than the plasma ignition threshold $I_Z$, such that the laser radiation 7a propagating in the second direction R2 ignites a plasma 21 in the gas 20 of the chamber 14. The laser radiation 7a propagating in the second direction R2 is absorbed, reflected and/or refracted at the plasma 21, such that the laser radiation 7a propagating in the second direction R2 extinguishes itself, that is to say that no or only a very small portion of the laser radiation 7 propagating in the second direction R2 leaves the chamber 14 through the entrance window 15a. The focusing device 16 and the collimation device 17 together form a passive plasma generating device 16, 17 configured for pulsed ignition of the plasma 21 in the gas 20 of the chamber 14.

Since the intensity $I_2$ of the laser radiation 7a reflected back at the target material T and propagating in the second direction R2 and possibly also the intensity $I_1$ of the laser radiation 7 propagating in the first direction R1 possibly vary depending on the ambient conditions, it has proved to be advantageous if the optical isolator 13 is configured to set the plasma ignition threshold $I_Z$ in the gas 20 of the chamber 14.

For this purpose, use can be made, for example, of a device 19a for setting the composition of the gas 20 in the chamber 14, which is integrated into the gas circuit 19 in order to suitably mix the gas constituents of the gas 20, for example to set the ratio between nitrogen and a noble gas that are fed as gas 20 or as gas mixture to the chamber 14. The composition of the gas 20 influences the plasma ignition threshold $I_Z$ in the chamber 14, such that the plasma ignition threshold $I_Z$ can be set by means of the device 19a.

By setting the plasma ignition threshold $I_Z$, however, it is also possible to use, for example, the optical arrangement shown in FIGS. 3A and 3B, which include a first focusing lens 16a for focusing the laser radiation 7 propagating in the first direction R1 onto a first laser beam focal point 18a, and a first collimation lens 17a for collimating the laser radiation 7 emanating from the first laser beam focal point 18a, and also a second focusing lens 16b for focusing the collimated laser radiation 7 onto a second laser beam focal point 18b. The divergent laser radiation 7 emanating from the second laser beam focal point 18b is collimated again by a second collimation lens 17b. The two focusing lenses 16a,b thus form a focusing device, and the two collimation lenses 17a,b form a collimation device for the laser radiation 7 propagating in the first direction R1.

The first and second focusing lenses 16a,b each have a first (nominal) focal length $f_1$ and the first and second collimation lenses 17a,b each have a second (nominal) focal length $f_2$. The first focusing lens 16a and the first collimation lens 17a are arranged at the distance of the sum of their focal lengths $f_1+f_2$ from one another, that is to say that they form a beam telescope. The same applies to the second focusing lens 16b and the second collimation lens 17b, which likewise form a beam telescope. Both the focusing lenses 16a,b and the collimation lenses 17a,b have a focal length $f_1$, $f_2$ that is settable (within certain limits), that is to say that adaptive optical elements are involved, the geometry of which can be altered by means of suitable actuators, for example to change the first focal length $f_1$ of the focusing lenses 16a,b by a magnitude $\Delta f_1$. In the case of such a change, with the aid of the actuators, the second focal length $f_2$ of the collimation lenses 17a,b is correspondingly adapted simultaneously as well, such that the distance between a respective focusing lens 16a,b and the associated collimation lens 17a,b corresponds to the sum of the (changed) focal lengths $f_1+f_2$.

As can be discerned well in FIGS. 3A and 3B, the first beam telescope magnifies the diameter of the laser radiation 7, wherein the imaging scale of the magnification is dependent on the quotient of the focal lengths $f_1/f_2$. A change in the focal lengths $f_1$, $f_2$ thus leads to a change in the imaging scale of the two beam telescopes, which results in a change $\Delta D$ in the diameter D of the laser radiation 7 at the first laser beam focal point 18a and respectively at the second laser beam focal point 18b. If the diameter D of the laser radiation 7 decreases, the intensity $I_1$ of the laser radiation 7 propagating in the first direction R1 and, respectively, the intensity $I_2$ of the laser radiation 7a propagating in the second direction R2 increase at the respective laser beam focal point 18a,b. If the diameter D increases, the intensity $I_1$ of the laser radiation 7 propagating in the first direction R1 and respectively the intensity $I_2$ of the laser radiation 7a propagating in the second direction R2 decrease at the respective laser beam focal point 18a,b. In this way, the plasma ignition threshold $I_Z$ can be set without variation here in the intensity $I_1$ of the laser radiation 7 propagating in the first direction R1 and entering the chamber 14 through the entrance window 15a or the intensity $I_2$ of the laser radiation 7a entering the chamber 14 through the exit window 15b.

The example shown in FIG. 3B differs from the example shown in FIG. 3A in that the first collimation lens 17a and the second focusing lens 16b are combined in a common lens element 17a, 16b having a (settable) focal length f2, such that only three adaptive optical elements are required for setting the diameter D of the laser beam focal point 18a, 18b.

In the examples shown in FIGS. 3A and 3B, it is possible for at least one, if appropriate all of the focusing lenses 16a,b and/or collimation lenses 17a,b to be arranged displaceably by means of suitable actuators in the beam path of the laser radiation 7, 7a, that is to say that these optical elements need not necessarily be configured adaptively for setting the diameter D of the laser radiation 7, 7a. Instead of adaptive focusing lenses 16a,b and/or collimation lenses 17a,b, it is also possible to use a plurality of focusing lenses 16a,b and/or collimation lenses 17a,b having different focal lengths, which, for the purpose of setting the diameter D of the laser radiation 7, 7a, can be exchanged manually or, if appropriate, using actuators and with the aid of a suitable control device of the driver laser system 12. Instead of the use of transmissive optical elements in the form of lenses, the collimation and/or the focusing of the laser radiation 7, 7a can also be performed wholly or partly with the aid of reflective optical elements, for example in the form of parabolic mirrors.

FIGS. 4A and 4B show an optical isolator 13 constructed like the optical isolator 13 illustrated in FIG. 1, i.e., including a focusing lens 16 and a collimation lens 17, which—in contrast to the illustration shown in FIG. 1—are arranged outside the chamber 14 so that the chamber 14 or the interior of the chamber 14 filled with the gas 20 can be dimensioned to be as small as possible. In contrast to the optical isolator 13 from FIG. 1, the chamber 14 of the optical isolator 13 in FIGS. 4A and 4B does not directly adjoin the second amplifier 4b or the third amplifier 4c, but rather is arranged in the freely propagating beam path of the laser radiation 7, 7a between the second optical amplifier 4b and the third optical amplifier 4c.

A loudspeaker 22 is arranged in the chamber 14 of the optical isolator 13 shown in FIGS. 4A and 4B. The loudspeaker is driven by means of a control device of the driver laser system 12 to generate a standing acoustic wave 24 in the gas 20 of the chamber 14. For this purpose, an acoustic reflector 23 is arranged at an opposite wall of the chamber 14 relative to the loudspeaker 22, which acoustic reflector reflects the acoustic wave generated by the loudspeaker 22 back to the latter, such that the standing acoustic wave 24 forms in the chamber 14. The intensity of the standing acoustic wave 24 in the chamber 14 can be set, as a result of which the gas pressure p of the gas 20 in the chamber 14, to put it more precisely at the laser beam focal point 18, varies by a magnitude $\Delta p$, such that the loudspeaker 22 together with the reflector 23 serves as a device for setting the plasma ignition threshold $I_Z$ for ignition of the plasma 21 in the gas 20 of the chamber 14. The chamber 14 of the optical isolator 13 shown in FIGS. 4A and 4B also has a gas circuit 19, the illustration of which has been dispensed with in FIG. 4 for reasons of clarity. The chamber 14 or the gas circuit 19 can comprise, if appropriate, a pressure control or pressure regulating device (not illustrated in the drawing) to set in the chamber 14 a (static) gas pressure p that promotes plasma formation in the chamber 25.

To produce a maximum suppression of the laser radiation 7a propagating in the second direction R2 (as shown in FIG. 4B), further optical isolators can be arranged in the EUV radiation producing apparatus 1 from FIG. 1. Typically, the optical isolators 13 are not arranged at the end of the amplifier arrangement 3, for example downstream of the last amplifier 4e, but rather at the beginning of the amplifier chain 3, i.e. for example upstream of the first amplifier 4a, upstream of the second amplifier 4b or upstream of the third amplifier 4c, since at these locations of the amplifier arrangement 3 the intensity I1 of the laser radiation 7 propagating in the first direction R1 (as shown in FIG. 4A) is typically greater than the intensity $I_2$ of the laser radiation 7a propagating in the second direction R2, such that, given a suitably set plasma ignition threshold $I_Z$, only the laser radiation 7a propagating in the second direction R2, but not the laser radiation 7 propagating in the first direction R1, ignites a plasma 21 in the chamber 14.

For the passive generation of the plasma 21 in the gas 20 of the chamber 14 it is not necessary to use laser radiation 7, 7a having the wavelength of a CO2 laser 2a, 2b; rather, laser radiation 7, 7a which is produced, e.g., by a solid-state laser and has a shorter wavelength of 1.06 μm, for example, can also generate a plasma 21 under suitable conditions in the gas 20 of the chamber 14.

FIG. 5 shows an EUV radiation producing apparatus 1, which differs from the EUV radiation producing apparatus 1 shown in FIG. 1 essentially in that instead of an optical isolator 13 including a passive plasma generating device in the form of the focusing and collimation devices 16, 17, three optical isolators 13a-c are arranged in the amplifier arrangement 3. In this case, the formation of a plasma 21 in the chamber 14 is performed in each case actively by means of an excitation laser 25, which is configured as an ultra-short-pulse laser in the example shown.

The excitation laser radiation 28 produced by the excitation laser 25 is fed to the optical isolators 13a-c via a feeding device 26 including, in the case of the example shown in FIG. 5, a first beam splitter 32a for splitting the power of the excitation laser radiation 28 produced by the excitation laser 25 between a first portion, which is fed to the first optical isolator 13a, and a second portion, which is fed to a first delay section 31a. The excitation laser radiation 28 that leaves the first delay section 31a is split at a second beam splitter 32b into a first portion, which is fed to the second optical isolator 13b, and into a second portion, which is fed to a second delay section 31b. The excitation laser radiation 28 that leaves the second delay section 31b is fed to the third optical isolator 13c via a beam deflection device 33 (deflection mirror). The two delay sections 31a, 31b make it possible to synchronize the excitation laser radiation 28 produced by the excitation laser 25 with the pulsed laser radiation 7 and respectively 7a that is generated by the beam source 2.

Figure 6A:
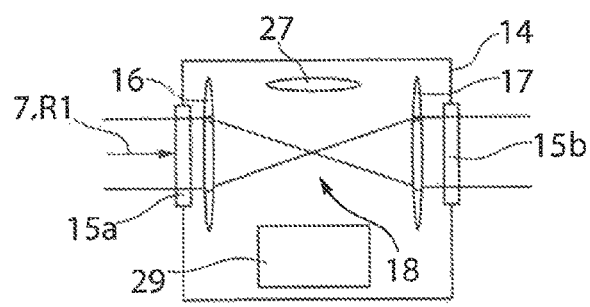
FIGS. 6A and 6B are a pair of schematic illustrations of one of the optical isolators shown in FIG. 5, wherein pulsed excitation laser radiation of the excitation laser ignites a plasma.
Figure 6B:
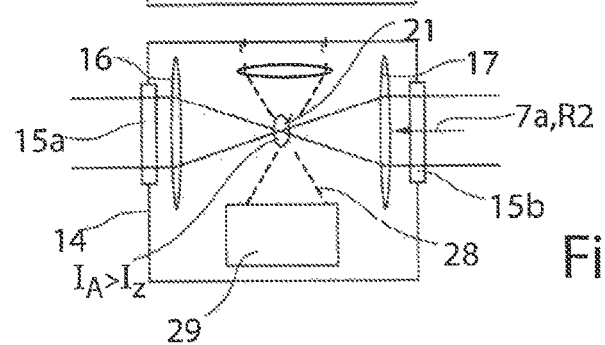

The synchronization is carried out in such a way that the excitation laser radiation 28 enters the chamber 14 of a respective optical isolator 13a-c and generates a plasma 21 there, while or immediately before the laser radiation 7a propagating in the second direction R2 enters the chamber 14, as is illustrated in FIG. 6B. While the laser radiation 7 propagating in the first direction R1 traverses the chamber 14, however, no excitation laser radiation 28 is radiated into the chamber 14, such that the plasma threshold $I_Z$ is not exceeded and the laser radiation 7 propagating in the first direction R1 can pass through the chamber 14 without being impeded (see FIG. 6A).

For the synchronization or for the selection of pulses of the excitation laser radiation 28, a switchable element 30 is arranged between the excitation laser 25 and the feeding device 26. The switchable element 30 can be configured, e.g., in the form of a chopper, to suppress individual pulses of the excitation laser radiation 28 in a targeted manner. The synchronization of the switchable element 30 with the pulsed laser radiation 7, 7a of the beam source 2 is carried out, in the example shown, by means of a control device 34 that is signal-connected to the excitation laser 25, the switchable element 30 and the beam source 2.

To produce in the chamber 14 an intensity $I_A$ of the excitation laser radiation 28, which exceeds the plasma ignition threshold $I_Z$ for ignition of the plasma 21, the feeding device 26 includes a focusing optical unit 27 in the form of a lens, as shown in FIG. 6A. The focusing optical unit 27 focuses the excitation laser radiation 28 onto the laser beam focal point 18 of the laser radiation 7 produced by the beam source 2 in order there to generate the plasma 21 and to absorb and/or to reflect the laser radiation 7a propagating in the second direction R2 and thus to impede it from passing through the chamber 14. As can likewise be discerned in FIG. 6B, a part of the excitation laser radiation 28 that does not contribute to the excitation or to the maintenance of the plasma 21 is captured in a beam trap 29.

Figure 7A:
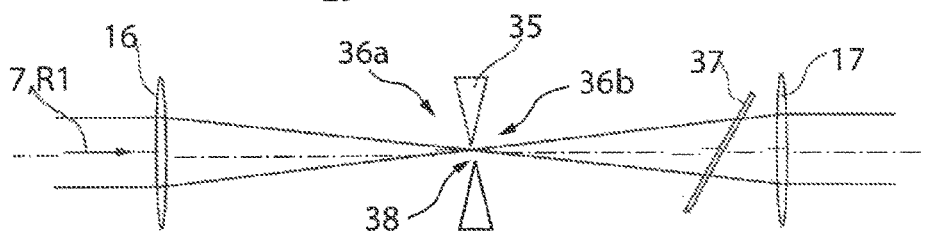
FIGS. 7A and 7B are a pair of related schematic illustrations, analogous to FIGS. 6A and 6B, wherein the pulsed excitation laser radiation of the excitation laser is reflected and focused at one side of a diaphragm.
Figure 7B:
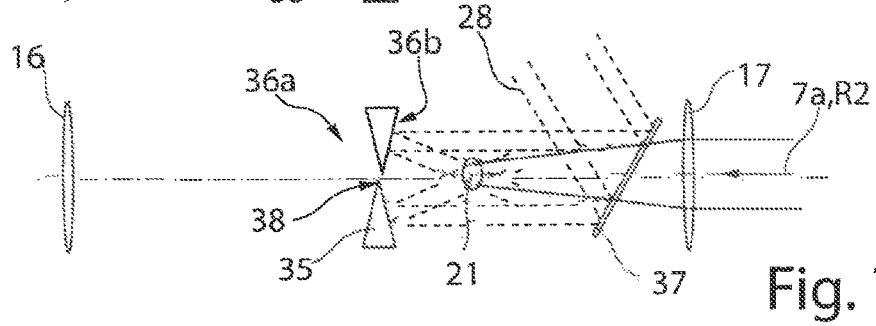

FIGS. 7A and 7B show an alternative possibility of focusing the excitation laser radiation 28 for generating a plasma 21 in the chamber 14 (not illustrated in these figures), specifically by virtue of a (spatial) diaphragm 35 arranged in the chamber 14 being used for this purpose. The (spatial) diaphragm 35 is configured rotationally symmetrically with respect to a center axis that coincides with the beam axis of the laser radiation 7, 7a, the beam axis being represented by a dash-dotted line in FIGS. 7A and 7B, which can be achieved by means of a suitable adjustment of the diaphragm 35.

In the example shown, the beam profile of the excitation laser radiation 28 is shaped with the aid of an axicon (not illustrated in the drawing) of the feeding device 26 to produce a rotationally symmetrical beam profile, the beam center of which has no or only a low intensity, such that the beam profile of the excitation laser radiation 28 forms a cylindrical hollow beam. The excitation laser radiation 28 shaped in this way impinges on a partly transmissive mirror 37 arranged in the beam path of the laser radiation 7 produced by the beam source 2 and is transmissive to the laser radiation. The excitation laser radiation 28, which, in the example shown, has a wavelength—deviating from the laser radiation 7—of approximately 1030 nm, for example, is deflected at the partly transmissive mirror 37 parallel to the beam axis or to the beam direction R1 of the laser radiation 7, such that the center of the hollow beam of the excitation laser radiation 28 formed in this way coincides with the center of the diaphragm aperture of the diaphragm 35.

The excitation laser radiation 28 thus impinges on the diaphragm 35 at a second side 36b and the hollow beam in this case omits the diaphragm aperture 38, such that the excitation laser radiation 28 does not pass through the diaphragm aperture 38 and reach the first side 36a of the diaphragm 35 facing the beam source 2. In this way, it is ensured that the excitation laser radiation 28 does not propagate further along the second direction R2 toward the beam source 2.

In the example shown, the diaphragm 35, to put it more precisely, a respective side 36a, 36b of the diaphragm 35, is configured in a conical fashion, i.e., a respective side 36a, 36b of the diaphragm 35, proceeding from the diaphragm aperture 38, extends in a radial direction not perpendicularly, but rather at an angle different than 90° with respect to the beam axis of the laser radiation 7, 7a. At the rotationally symmetrical, conical surface formed at the second side 36b of the diaphragm 35, the excitation laser radiation 28 is reflected in a radial direction inward, i.e., in the direction of the beam axis of the laser radiation 7 produced by the beam source 2.

The excitation laser radiation 28 reflected at the second side 36b of the diaphragm 35 forms a Bessel beam with an elongated focus zone in the region of the beam axis of the laser radiation 7, at which the plasma 21 is formed. In the example shown in FIG. 7B, the plasma 21 is therefore not ignited at the laser beam focal point 18 of the laser radiation 7 produced by the beam source 2, wherein the laser beam focal point lies within the diaphragm aperture 38 as shown in FIG. 7A, but rather at a location which is at a distance from the diaphragm 35 and at which the excitation laser radiation 28 is focused as shown in FIG. 7B.

In the case of the active plasma generation described in association with FIG. 5 to FIG. 7B, in the case of which the excitation laser 25 serves as a plasma generating device, it is possible to ignite the plasma 21 in the chamber 14 not only during the time duration of the pulsed back-reflected laser radiation 7a to prevent the latter from passing through the chamber 14, but rather in principle during the entire time period in which the laser radiation 7 propagating in the first direction R1 does not pass through the chamber 14.

In particular, also or in addition to the time duration required for suppressing the laser radiation 7a propagating in the second direction R2, the excitation laser 25 can ignite the plasma 21 between the emergence of the laser radiation 7 propagating in the first direction R1 from the chamber 14 and the entrance of the laser radiation 7a propagating in the second direction R2. Likewise, the excitation laser 25 can be driven with the aid of the control device 34 to generate the plasma 21 even after the suppression of the passage of the laser radiation 7a propagating in the second direction R2 and before the entrance of further laser radiation 7 propagating in the first direction R1 (in the form of a subsequent laser pulse). In this way, it is possible to prevent so-called self-lasing, i.e., the undesired build-up of oscillation of laser modes in the amplifier arrangement 3, to put it more precisely, in the optical amplifiers 4a-e thereof, since these are optically decoupled from one another even in the inter-pulse periods in which no laser radiation 7, 7a propagating in the first direction R1 or respectively in the second direction R2 passes through the chamber 14. The optical decoupling or the suppression of self-lasing of the plasma 21 is greater than would be the case with optical decoupling only through the use of the (spatial) diaphragm 35.

In the case of the EUV radiation producing apparatus 1 shown in FIG. 5, the excitation laser 25 can also be used merely to adapt or to reduce the plasma ignition threshold $I_Z$, such that the plasma 21 can be ignited by the laser radiation 7a propagating in the second direction R2 even if the laser radiation has a comparatively low intensity $I_2$ which, without the excitation laser radiation 28, would not suffice for ignition of the plasma 21. Moreover, the intensity $I_4$ of the excitation laser radiation 28 can be increased only to an extent such that although the plasma ignition threshold $I_Z$ is exceeded, the plasma 21 generated in this way does not suffice to completely suppress the laser radiation 7a propagating in the second direction R2. In this case, however, part of the laser radiation 7a propagating in the second direction R2 is absorbed in the plasma 21, which leads to a further spreading of the plasma 21 and thus to the formation of the full filter performance of the respective optical isolator 4a-e.

In addition to the use of the optical isolators 13, 13a-c described above, which are based on the principle of optical isolation by ignition of a plasma 21, further optical isolators in the form of conventional (e.g., Faraday) isolators or the like can be used, if appropriate, in the driver laser system 12 described herein. However, the field of application of the isolators is restricted to comparatively low laser powers, such that these are typically used only in the beam source 2 downstream of a respective CO2 laser 2a, 2b and possibly downstream of the first optical amplifier 4a (and upstream of the first optical isolator 13a), since the power of the laser radiation 7, 7a that occurs there generally does not lead to damage or destruction thereof.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A driver laser system for an extreme ultraviolet (EUV) radiation producing apparatus, comprising:
   a beam source for producing laser radiation propagating in a first direction;
   an amplifier arrangement comprising at least one optical amplifier for amplifying the laser radiation propagating in the first direction; and
   at least one optical isolator, wherein the optical isolator comprises
      a chamber filled with a gas, through which chamber the laser radiation propagating in the first direction passes; and
      a plasma generating device configured for the pulsed ignition of a plasma in the gas of the chamber, wherein ignition of the plasma in the chamber suppresses passage of laser radiation propagating in a second direction, opposite to the first direction, through the chamber.

2. The driver laser system of claim 1, further comprising a focusing device that focuses the laser radiation propagating in the first direction onto a laser beam focal point in the chamber.

3. The driver laser system of claim 2, further comprising a collimation device that collimates the laser radiation emanating from the laser beam focal point and propagating in the first direction.

4. The driver laser system of claim 3, wherein an intensity (I1) of the laser radiation propagating in the first direction in the gas of the chamber is less than a plasma ignition threshold (IZ) for the ignition of the plasma in the gas of the chamber, and wherein the intensity (I2) of the laser radiation propagating in the second direction in the gas of the chamber is greater than the plasma ignition threshold (IZ) for the ignition of the plasma in the gas of the chamber.

5. The driver laser system of claim 3, wherein the focusing device, the collimation device, or both the focusing device and the collimation device are configured for setting a focus diameter of the laser beam focal point in the chamber.

6. The driver laser system of claim 5, wherein the focusing device, the collimation device, or both the focusing device and the collimating device comprise at least one optical element displaceable along a beam direction of the laser radiation, at least one optical element having a settable focal length, or both.

7. The driver laser system of claim 1, wherein the optical isolator is arranged in a beam path of the laser radiation propagating in the first direction upstream of a first amplifier, upstream of a second amplifier, or upstream of a third amplifier of the amplifier arrangement.

8. The driver laser system of claim 1, wherein the optical isolator is configured to set a plasma ignition threshold (IZ) for the ignition of the plasma in the chamber.

9. The driver laser system of claim 8, wherein the optical isolator comprises a gas pressure setting device for setting a gas pressure of the gas in the chamber.

10. The driver laser system of claim 9, wherein the gas pressure setting device is configured to generate a standing acoustic wave in the chamber.

11. The driver laser system of claim 8, wherein the optical isolator comprises a device for setting a composition of the gas in the chamber.

12. The driver laser system of claim 8, wherein the optical isolator comprises a gas circuit for feeding the gas into the chamber and for discharging the gas from the chamber.

13. The driver laser system of claim 8, wherein the optical isolator comprises an excitation laser for producing excitation laser radiation, and wherein the driver laser system further comprises a feeding device that feeds the excitation laser radiation into the chamber for heating the gas in the chamber.

14. The driver laser system of claim 13, wherein the excitation laser is a short-pulse laser or an ultrashort-pulse laser.

15. The driver laser system of claim 13, wherein the feeding device comprises a focusing optical unit to focus the excitation laser radiation in the chamber.

16. The driver laser system of claim 15, further comprising a diaphragm arranged in the chamber, wherein the laser radiation propagating in the first direction passes through a diaphragm aperture of the diaphragm, wherein a first side of the diaphragm forms a reflective focusing optical unit for focusing the excitation laser radiation.

17. The driver laser system of claim 16, wherein the feeding device is configured to radiate the excitation laser radiation in the form of a hollow beam omitting the diaphragm aperture onto the first side of the diaphragm.

18. The driver laser system of claim 17, wherein the first side of the diaphragm faces away from the beam source.

19. The driver laser system of claim 13, further comprising a control device configured to drive the excitation laser for producing the excitation laser radiation to ignite a plasma in the gas of the chamber and also between the emergence of the laser radiation propagating in the first direction from the chamber and the entrance of the laser radiation propagating in the second direction into the chamber.

20. The driver laser system of claim 13, further comprising a switchable element for selecting pulses of the excitation laser radiation.

21. The driver laser system of claim 20, wherein the feeding device comprises at least one delay section for delaying the excitation laser radiation before feeding the excitation laser radiation to at least one optical isolator.

22. The driver laser system of claim 13, further comprising at least two optical isolators, and wherein the feeding device comprises at least one beam splitter for splitting the excitation laser radiation between the optical isolators.

23. An EUV radiation producing apparatus, comprising:
a driver laser system of claim 1;
a vacuum chamber, in which a target material can be arranged; and
a beam guiding device to guide the laser radiation propagating in the first direction from the driver laser system to the target material.

24. The driver laser system of claim 1, wherein the plasma suppresses the passage of the laser radiation propagating in the second direction by at least one of absorption, reflection, and refraction.

* * * * *